United States Patent
Kataoka

(10) Patent No.: US 10,840,188 B2
(45) Date of Patent: Nov. 17, 2020

(54) SEMICONDUCTOR DEVICE

(71) Applicant: TOSHIBA MEMORY CORPORATION, Tokyo (JP)

(72) Inventor: Atsushi Kataoka, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/285,038

(22) Filed: Feb. 25, 2019

(65) Prior Publication Data

US 2020/0051917 A1  Feb. 13, 2020

(30) Foreign Application Priority Data

Aug. 7, 2018  (JP) .................. 2018-148750

(51) Int. Cl.
*H01L 23/538* (2006.01)
*H01L 25/18* (2006.01)
*H01L 23/00* (2006.01)
*H01L 21/56* (2006.01)
*H01L 23/31* (2006.01)

(52) U.S. Cl.
CPC ........ *H01L 23/5383* (2013.01); *H01L 21/563* (2013.01); *H01L 21/565* (2013.01); *H01L 23/3128* (2013.01); *H01L 23/5386* (2013.01); *H01L 24/09* (2013.01); *H01L 24/17* (2013.01); *H01L 24/33* (2013.01); *H01L 24/49* (2013.01); *H01L 24/73* (2013.01); *H01L 25/18* (2013.01); *H01L 2224/0401* (2013.01); *H01L 2224/73265* (2013.01)

(58) Field of Classification Search
CPC ............. H01L 23/5383; H01L 23/3128; H01L 23/5386; H01L 21/563; H01L 21/565; H01L 24/09; H01L 24/17; H01L 24/33; H01L 24/49; H01L 24/73; H01L 25/18; H01L 2224/0401; H01L 2224/73265
USPC ........................................................ 257/690
See application file for complete search history.

(56) References Cited

U.S. PATENT DOCUMENTS

2005/0258447 A1   11/2005  Oi et al.
2013/0256854 A1   10/2013  Kobayashi et al.
2015/0235966 A1*  8/2015   Ohhashi ............... H01L 23/552
                                                              257/659

(Continued)

FOREIGN PATENT DOCUMENTS

JP   2005-256128 A   9/2005
JP   5672911 B2      2/2015

*Primary Examiner* — Tu-Tu V Ho
(74) *Attorney, Agent, or Firm* — Foley & Lardner LLP

(57) ABSTRACT

A semiconductor device includes a substrate having a first surface, a second surface opposite to the first surface, and a side surface extending between the first surface and the second surface; a pad electrode provided on the first surface of the substrate; an internal wiring provided in the substrate, and electrically connected to the pad electrode; a first wiring provided in the substrate, and exposed from the substrate at the side surface; an insulator provided between the first wiring and the internal wiring so as to separate the first wiring from the internal wiring; a semiconductor chip provided on the substrate, and electrically connected to the pad electrode; and a resin covering the semiconductor chip.

20 Claims, 7 Drawing Sheets

(56) References Cited

U.S. PATENT DOCUMENTS

2017/0050842 A1   2/2017  Yamada et al.
2018/0092201 A1*  3/2018  Otsubo .................. H01L 23/00

* cited by examiner

SEMICONDUCTOR DEVICE

This application claims the benefit of and priority to Japanese Patent Application No. 2018-148750, filed Aug. 7, 2018, the entire contents of which are incorporated herein by reference.

FIELD

Embodiments described herein relate generally to a semiconductor device.

BACKGROUND

A semiconductor package, such as a ball grid array (BGA) package, can be formed by mounting a semiconductor chip on a wiring board, electrically connecting the semiconductor chip and the wiring board, and covering the semiconductor chip with a resin. In such a semiconductor package, the surface of a bonding pad of the wiring board may be plated with a metallic material. When the surface of the bonding pad is plated using an electrolytic plating method, the plating may involve providing a plating wiring electrically connected to the bonding pad in order to apply voltage to the bonding pad.

The plating wiring may be provided in common for a plurality of wiring boards before individualization, and may be used as an electrode when plating treatment is performed on the plurality of wiring boards at the same time. After the plating treatment, when the wiring boards are individualized, the plating wiring on a dicing line is removed, but a part of the plating wiring remains on a wiring board, and is exposed from the outer surface of the wiring board.

DETAILED DESCRIPTION

Figure 1:
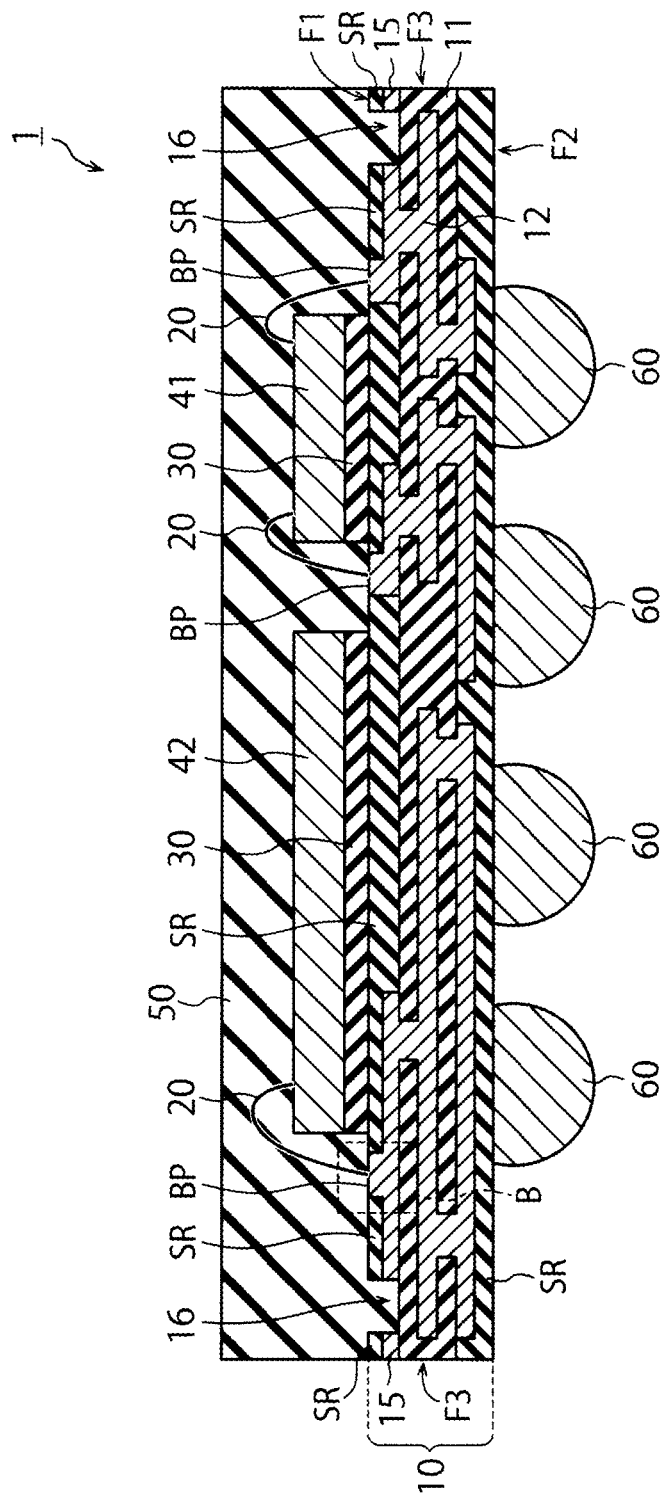
FIG. 1 is a cross-sectional view showing a configuration example of a semiconductor device according to a first embodiment.

Embodiments described herein provide for a semiconductor device capable of preventing progression of corrosion from a plating wiring to an internal wiring.

In general, according to one embodiment, A semiconductor device includes a substrate having a first surface, a second surface opposite to the first surface, and a side surface extending between the first surface and the second surface; a pad electrode provided on the first surface of the substrate; an internal wiring provided in the substrate, and electrically connected to the pad electrode; a first wiring provided in the substrate, and exposed from the substrate at the side surface; an insulator provided between the first wiring and the internal wiring so as to separate the first wiring from the internal wiring; a semiconductor chip provided on the substrate, and electrically connected to the pad electrode; and a resin covering the semiconductor chip.

Embodiments of the present disclosure will be described below with reference to the accompanying drawings. The embodiments do not limit the present disclosure. In the following embodiments, a vertical direction of a substrate indicates a relative direction when a surface on which a semiconductor chip is provided is assumed to be upward, and may be different from a vertical direction according to gravitational acceleration. The drawings are schematic or conceptual, and the ratio of respective parts does not always represent a ratio in practice. In the specification and drawings, the same reference numerals are assigned to the same or similar components as those already described with reference to previous drawings, and detailed description thereof may be omitted as appropriate.

First Embodiment

FIG. 1 is a cross-sectional view showing a configuration example of a semiconductor device according to a first embodiment. A semiconductor device 1 of the embodiment is a surface-mounting type semiconductor package, such as a BGA package, a MAP (Mold Array Package), an LGA (Land Grid Array Package), or a CSP (Chip Size Package). The semiconductor device 1 may be a semiconductor storage device, such as a NAND flash memory.

The semiconductor device 1 includes a resin substrate 10, semiconductor chips 41 and 42, a mold resin 50, and a metal bump 60.

The resin substrate 10 has a first surface F1, a second surface F2 opposite to the first surface F1, and a side surface F3 extending between the first surface F1 and the second surface F2. A planar shape of the resin substrate 10 may be substantially rectangular or substantially square but is not limited thereto. The resin substrate 10 may include, for example, a multilayer wiring board in which a plurality of insulating layers 11 and a plurality of wiring layers 12 are disposed (e.g., stacked and integrated). For example, a glass epoxy resin, an organic polymer material or a ceramic material (for example, aluminum oxide ($Al_2O_3$)) is included in the insulating layer 11. Each wiring layer 12 (which may constitute an internal wiring) is provided in the resin substrate 10, and is electrically connected to a bonding pad BP. For example, a low resistance conductive material such as copper is included in the wiring layer 12. It is noted that different layouts of the wiring layers 12 are possible, and the design may be changed according to design specifications of the semiconductor device 1.

A solder resist SR and the bonding pad BP (which may constitute a pad electrode) are provided on the first surface F1 of the resin substrate 10. The solder resist SR is not provided on the bonding pad BP, and the bonding pad BP is exposed from the solder resist SR on the first surface F1. The electrode material of the bonding pad BP includes a material (e.g., copper) similar to, or the same as, that of the wiring layer 12, and its surface is plated with metal films 13 and 14 as shown in FIG. 2.

Figure 2:
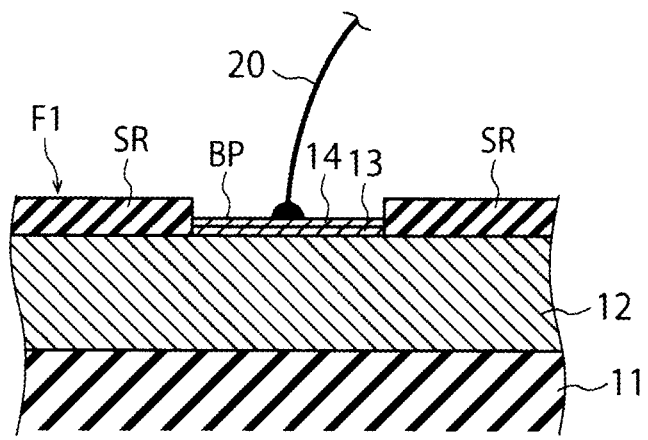
FIG. 2 is a cross-sectional view showing a configuration of a bonding pad and its surroundings according to the first embodiment.

FIG. 2 is a cross-sectional view showing the bonding pad BP in the broken line frame B in FIG. 1 and its surroundings. For example, a low resistance conductive material, such as nickel or gold, is included in the metal films 13 and 14. When the metal film 13 is made of nickel, and the metal film 14 is made of gold, the metal films 13, 14 form a stacked film of nickel and gold. The metal films 13 and 14 are formed on the surface of the electrode material (e.g., copper) of the bonding pad BP by, for example, an electrolytic plating method. Nickel in the metal film 13 relatively strongly joins gold as the metal film 14 and copper as the electrode material. The gold in the metal film 14 joins a metal wire 20 to the bonding pad BP with low resistance when the metal wire 20 is bonded. The same material (e.g., gold) as that of the metal film 14 is included in the metal wire 20. As a result, the metal wire 20 is relatively strongly joined to the metal film 14.

A plating wiring 15 as the first wiring is provided on the side surface F3 of the resin substrate 10. The plating wiring 15 is provided in the resin substrate 10, and is exposed from the resin substrate 10 at the side surface F3. The plating wiring 15 is made of the same material as that of the wiring layer 12 (and may have been formed as a part of the wiring layer 12). For example, copper is included in the plating wiring 15. The plating wiring 15 is a wiring configured for plating the metal films 13 and 14 on the surface of the bonding pad BP, and is electrically connected to the bonding pad BP via the wiring layer 12 when plating treatment is performed. After the plating treatment, a recess portion 16 is provided between the plating wiring 15 and the wiring layer 12, and electrically and physically separates the plating wiring 15 from the wiring layer 12. Therefore, in the completed semiconductor device 1, the plating wiring 15 is parted from the wiring layer 12, and is in an electrically floating state. In this manner, the plating wiring 15 is parted from the wiring layer 12 while being exposed from the side surface F3 of the resin substrate 10.

Semiconductor chips 41, 42 are bonded to the first surface F1 of the resin substrate 10 via an adhesive layer (e.g., a DAF (Die Attachment Film)) 30. The semiconductor chip 41 may include, for example, a controller chip of a NAND flash memory. The semiconductor chip 42 may include, for example, a memory chip of a NAND flash memory. Each of the semiconductor chips 41 and 42 is electrically connected to the bonding pad BP of the resin substrate 10 via the metal wire 20. It is noted that the semiconductor chips 41 and 42 are not limited to the controller chip and the memory chip of the NAND flash memory, and any semiconductor chip may be used.

The mold resin 50 covers the semiconductor chips 41, 42 and the metal wire 20 on the first surface F1 of the resin substrate 10, and protects them from the outside of the semiconductor device 1. Further, the recess portion 16 is provided in the first surface F1 of the resin substrate 10, and the mold resin 50 enters and fills (at least in part) the recess portion 16. The mold resin 50 in the recess portion 16 insulates the plating wiring 15 from the wiring layer 12. Therefore, in the recess portion 16, the cut surface of the plating wiring 15 is covered with the mold resin 50, and is in contact with the mold resin 50.

In the embodiment, the plating wiring 15 is provided closer to the first surface F1 than to the second surface F2. The recess portion 16 is formed in the first surface F1 of the resin substrate 10, and separates the plating wiring 15 from the wiring layer 12. In addition, not only the plating wiring 15 but also a solder resist film is removed on a region between the plating wiring 15 and the wiring layer 12 in which the recess portion 16 is provided. The recess portion 16 is filled (at least in part) with the mold resin 50.

The metal bump 60 is provided on the second surface F2 of the resin substrate 10. Although not shown, the metal bump 60 is connected to the wiring layer 12 on the second surface F2 side, and is electrically connected to any of the semiconductor chips 41, 42 via the wiring layer 12. For example, a conductive metal, such as solder, is included in the metal bump 60. It is noted that, instead of the metal bump 60, a substantially flat land portion may be used.

Figure 3:
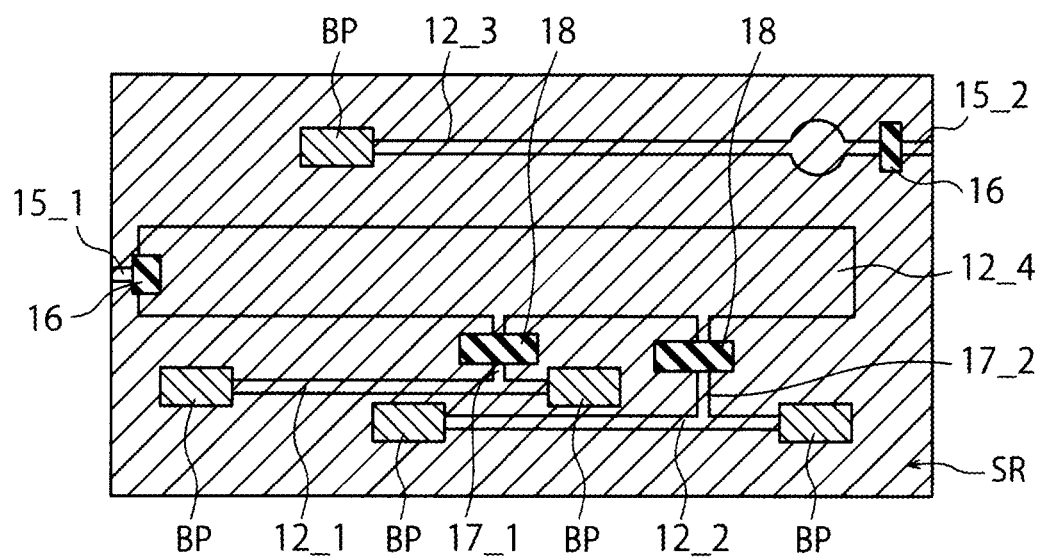
FIG. 3 is a plan view showing a configuration example of a resin substrate according to the first embodiment.

FIG. 3 is a plan view showing a configuration example of the resin substrate 10 according to the first embodiment. The plan view of FIG. 3 is a plan view as seen from the first surface F1 side. A wiring layer 12_1 is a first signal line, a wiring layer 12_2 is a second signal line, and a wiring layer 12_3 is a third signal line. Further, a wiring layer 12_4 is a ground wiring or a power supply wiring. Hereinafter, wiring layers 12_1 to 12_3 are referred to as first to third signal lines, and the wiring layer 12_4 is referred to as a ground/power supply wiring.

The first to third signal lines 12_1 to 12_3 are wirings for transmitting a control signal and data to the controller chip 41 or the NAND memory chip 42. The ground/power supply wiring 12_4 is a wiring connected to a ground or power supply, and is used as a ground or a power supply of the controller chip 41 or the NAND memory chip 42. The first to third signal lines 12_1 to 12_3 and the ground/power supply wiring 12_4 are covered with the solder resist SR provided on the first surface F1.

The bonding pad BP is connected to any of the first to third signal lines 12_1 to 12_3 and the ground/power supply wiring 12_4, and is exposed from the solder resist SR for bonding the metal wire 20.

Here, in order to electroplate the surface of the bonding pad BP, the bonding pad BP is electrically connected to an external electrode (not shown) during the plating treatment. During the plating treatment, at a time when the recess portions 16, 18 are not yet formed, the ground/power supply wiring 12_4 is connected to the plating wiring 15_1. Thus, the ground/power supply wiring 12_4 is electrically connected to an external electrode via the plating wiring 15_1. The third signal line 12_3 is connected to the plating wiring 15_2, and is electrically connected to an external plating electrode via the plating wiring 15_2. Further, the first signal line 12_1 is electrically connected to the ground/power supply wiring 12_4 via a plating wiring 17_1. The second signal line 12_2 is electrically connected to the ground/power supply wiring 12_4 via a plating wiring 17_2. Thus, the first and second signal lines 12_1 and 12_2 are electrically connected to the plating wiring 15_1 via the plating wirings 17_1 and 17_2 and the ground/power supply wiring 12_4. As a result, during the plating treatment, all bonding pads BP may be electrically connected to any of the plating wirings 15_1 and 15_2, and may be electrolytically plated.

When the recess portion 16 is formed after the electrolytic plating treatment, the plating wirings 15_1 and 15_2 exposed from the side surface F3 are separated from the ground/power supply wiring 12_4 and the third signal line 12_3. The recess portion 16 is filled with the mold resin 50 in a later process. Therefore, the mold resin 50 is provided between the plating wiring 15_1 and the ground/power supply wiring 12_4 and between the plating wiring 15_2 and the third signal line 12_3. As a result, corrosion progressing from the exposed portions of the plating wirings 15_1 and 15_2 is blocked by the mold resin 50, and does not progress to the ground/power supply wiring 12_4 and the third signal line 12_3. Therefore, the recess portion 16 and the mold resin 50 in the recess portion 16 can protect the ground/power supply wiring 12_4 and the third signal line 12_3 from corrosion.

Further, when the recess portion 18 is formed, the first and second signal lines 12_1 and 12_2 are electrically disconnected from the ground/power supply wiring 12_4. Accordingly, the first and second signal lines 12_1 and 12_2 are also electrically separated from each other. Thus, each of the first and second signal lines 12_1 and 12_2 can transmit individual signals (control signal or data) to the controller chip 41 or the NAND memory chip 42. In addition, the ground/power supply wiring 12_4 can supply the ground voltage or the power supply voltage to the controller chip 41 or the NAND memory chip 42.

Next, a method for manufacturing the semiconductor device 1 according to the embodiment will be described.

Figure 4A:
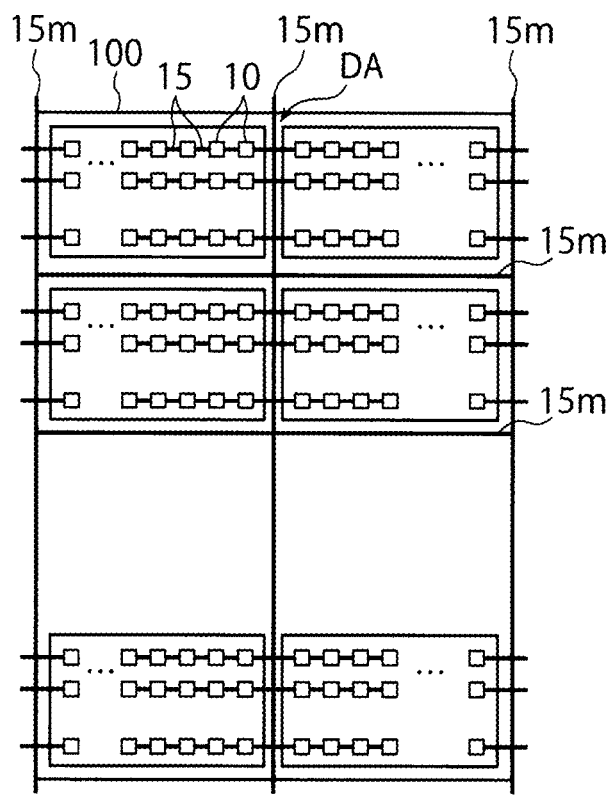
FIGS. 4A to 4C are diagrams showing an example of a method for manufacturing a semiconductor device according to the first embodiment.
Figure 4B:
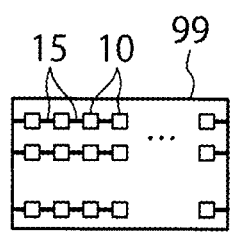
Figure 4C:

FIGS. 4A to 4C are diagrams showing an example of a method for manufacturing the semiconductor device 1 according to the first embodiment. First, in order to form the resin substrate 10, a substrate panel 100 in which a plurality of resin substrates 10 are included as shown in FIG. 4A is formed or provided. In the substrate panel 100, a plurality of adjacent resin substrates 10 are connected by a plating wiring 15. That is, the plating wiring 15 for the plurality of adjacent resin substrates 10 is provided across the plurality of resin substrates 10, and connected between the plurality of resin substrates 10. In addition, a common plating wiring 15m is provided along a dicing area DA between the adjacent resin substrates 10, and each plating wiring 15 for the adjacent resin substrates 10 is connected to the common plating wiring 15m. The common plating wiring 15m extends to the outer periphery of the substrate panel 100, and one end of the common plating wiring 15m is exposed from the side surface of the substrate panel 100. The common plating wiring 15m is electrically connected to the bonding pad BP (see FIG. 3) for the plurality of resin substrates 10 in the substrate panel 100. Thus, voltage can be applied from the outside of the substrate panel 100 to the bonding pad BP via the common plating wiring 15m, and the bonding pads BP for the plurality of resin substrates 10 can be simultaneously plated in the state of the substrate panel 100.

After the plating treatment, the recess portions 16 and 18 in FIG. 3 are formed by using a lithography technique and an etching technique, so that the plating wirings 15_1 and 15_2 are disconnected from the wiring layers 12_1 to 12_4. The process of forming the recess portions will be described in more detail later with reference to FIGS. 5A to 10.

Next, the substrate panel 100 is diced using a dicing blade. At this time, the dicing blade removes the dicing area DA between the adjacent resin substrates 10 together with the common plating wiring 15m. In the dicing process, as shown in FIGS. 4B and 4C, the substrate panel 100 is cut into blocks 99 including a plurality of resin substrates 10, and each block 99 is cut into resin substrates 10 for individualization. Thus, the common plating wiring 15m between the adjacent blocks 99 and the plating wiring 15 between the adjacent resin substrates 10 are cut. However, a remnant portion of the plating wiring 15 remains at the end of each resin substrate 10, and is exposed at the side surface F3. As shown in FIG. 1, the resin substrate 10 is used as a mounting substrate of the controller chip 41 and the memory chip 42.

FIGS. 5A to 10 are cross-sectional views showing a method for manufacturing the substrate panel 100 of FIG. 4A. FIGS. 5A to 10 each show an end surface corresponding to one resin substrate 10 in the substrate panel 100 shown in FIG. 4A.

Figure 5A:
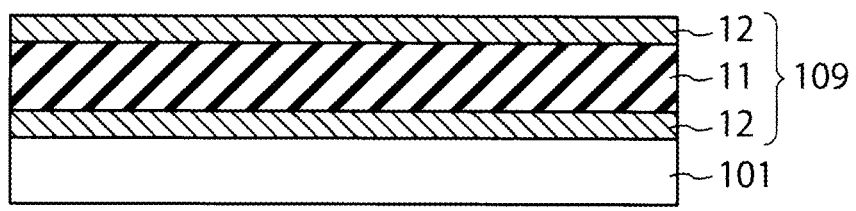
FIGS. 5A and 5B are cross-sectional views showing a method for manufacturing a substrate panel.

First, as shown in FIG. 5A, a wiring layer (for example, a copper film) 12 is formed on both surfaces of an insulating layer (prepreg) 11 including, for example, a glass epoxy resin. A stacked structure 109 of the insulating layer 11 sandwiched between two of the wiring layers 12 is mounted on a supporting substrate 101.

Figure 5B:
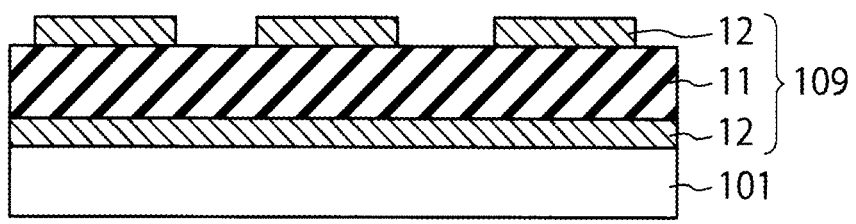
Figure 6A:
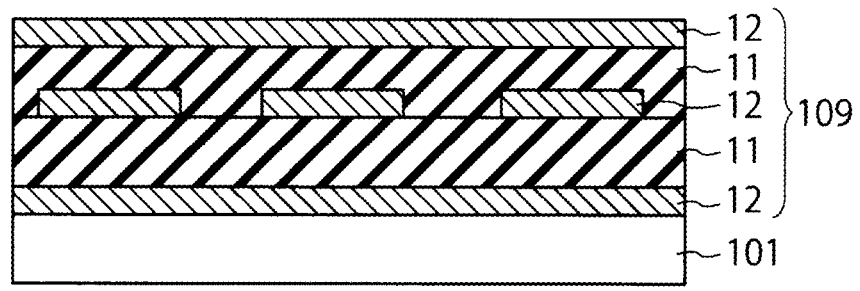
FIGS. 6A and 6B are cross-sectional views showing a method for manufacturing a substrate panel continued from FIG. 5B.

Next, as shown in FIG. 5B, the wiring layer 12 on the upper surface of the stacked structure 109 is processed into a desired wiring pattern by using the lithography technique and the etching technique. Further, as shown in FIG. 6A, another insulating layer 11 and another wiring layer 12 are stacked on the stacked structure 109. In this manner, the stacked structure 109 in which a plurality of insulating layers 11 and a plurality of wiring layers 12 are stacked and integrated is formed.

Figure 6B:
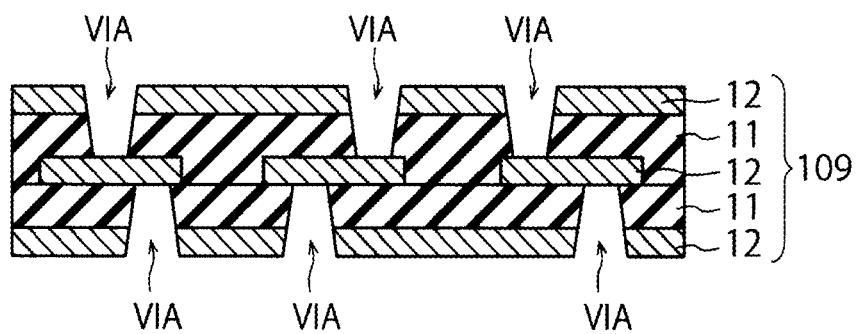

After the stacked structure 109 is separated from the supporting substrate 101, a VIA hole reaching the internal wiring layer 12 is formed on the upper surface and the back surface of the stacked structure 109 as shown in FIG. 6B by using the lithography technique and the etching technique.

Figure 7A:
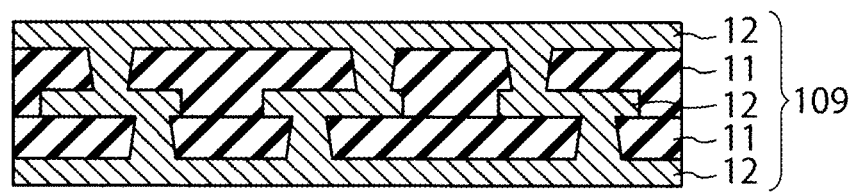
FIGS. 7A and 7B are cross-sectional views showing a method for manufacturing a substrate panel continued from FIG. 6B.

After the VIA hole is filled with a conductor (e.g., copper), as shown in FIG. 7A, other wiring layers 12 are further stacked on the upper surface and the back surface of the stacked structure 109.

Figure 7B:
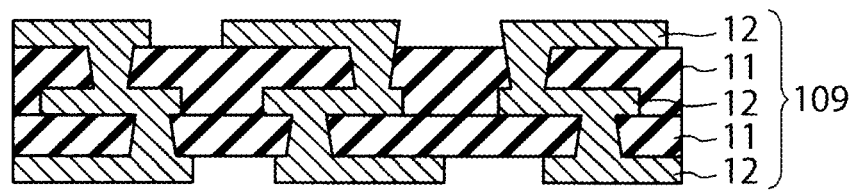

Next, as shown in FIG. 7B, each wiring layer 12 on the upper surface and the back surface of the stacked structure 109 is processed by using the lithography technique and the etching technique.

Figure 8A:
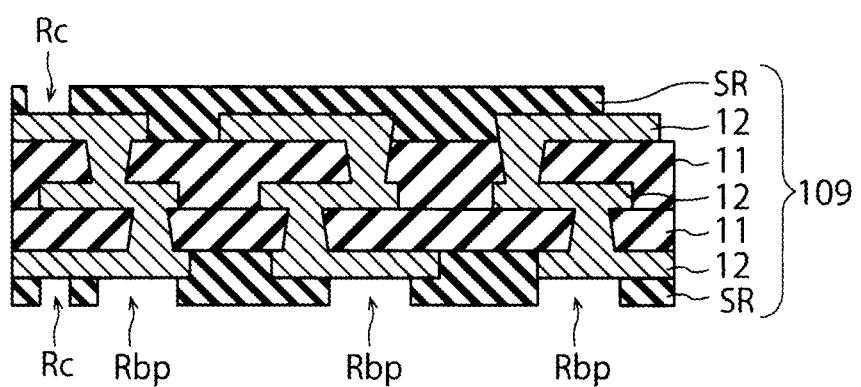
FIGS. 8A and 8B are cross-sectional views showing a method for manufacturing a substrate panel continued from FIG. 7B.

Next, as shown in FIG. 8A, a solder resist SR is formed on each of the front surface and the back surface of the stacked structure 109, and the solder resist SR in a region Rbp where the bonding pad BP and the metal bump 60 are formed is removed by using the lithography technique and the etching technique. The solder resist SR in a region Rc where the recess portions 16 and 18 are formed shown in FIG. 3 is also removed.

Figure 8B:
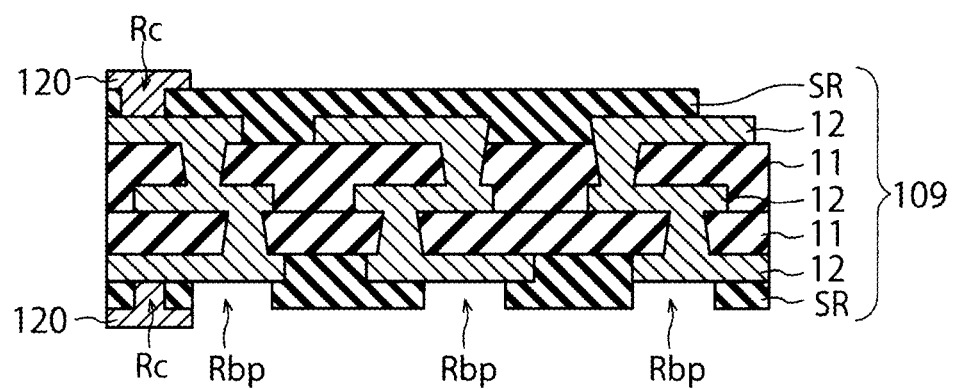

Next, as shown in FIG. 8B, a mask 120 is formed in the region Rc by using the lithography technique.

Figure 9A:
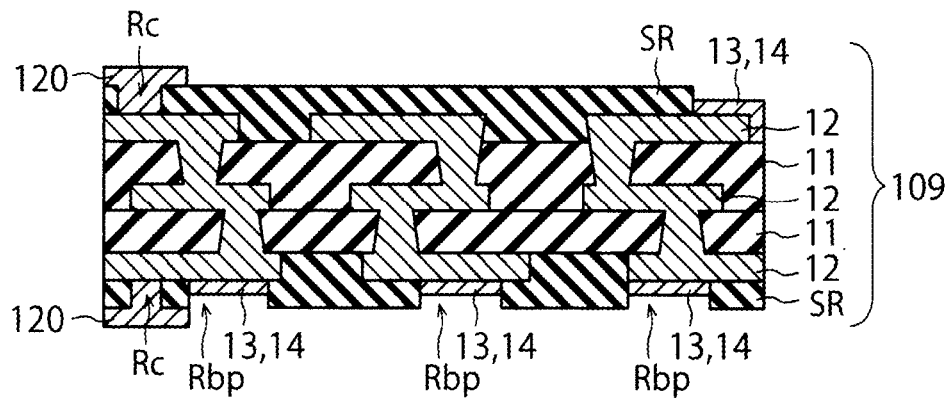
FIGS. 9A and 9B are cross-sectional views showing a method for manufacturing a substrate panel continued from FIG. 8B.

Next, as shown in FIG. 9A, an electrolytic plating treatment is performed on the region Rbp where the bonding pad BP and the metal bump 60 are formed. At this time, the wiring layer 12 is electrically connected to the plating wiring 15, and the metal films 13, 14 can be formed in the region Rbp by electrolytic plating. At this time, since the mask 120 is provided in the region Rc, the metal films 13 and 14 are not plated in the region Rc where the recess portions 16 and 18 are formed.

Figure 9B:
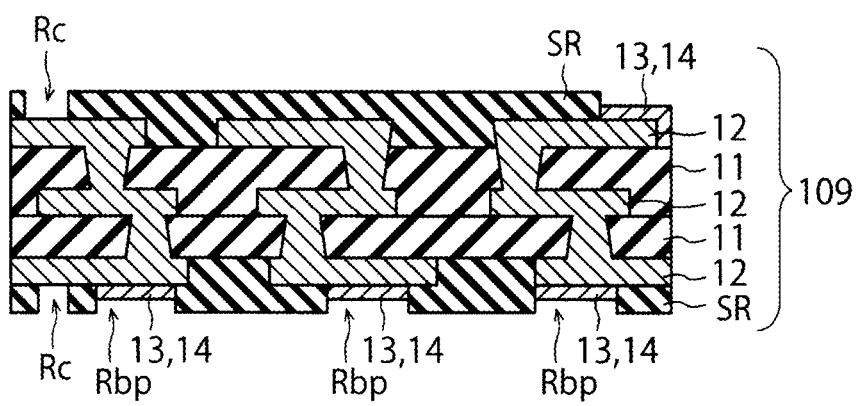
Figure 10:
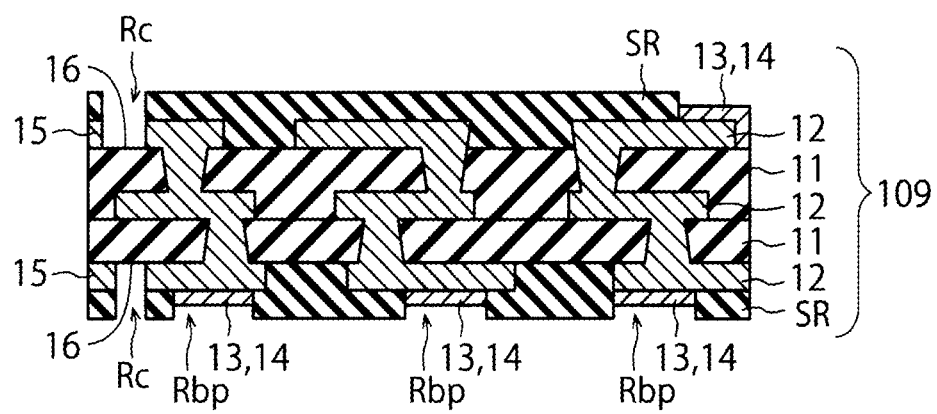
FIG. 10 is a cross-sectional view showing a method for manufacturing a substrate panel continued from FIG. 9B.

Next, after the mask 120 is removed as shown in FIG. 9B, the wiring layer 12 in the region Rc is etched using the solder resist SR as a mask as shown in FIG. 10. Thus, the recess portions 16, 18 are formed, and the plating wiring 15 is disconnected from the wiring layer 12. Further, the wirings 17_1 and 17_2 in FIG. 3 are also disconnected. At this time, although the metal films 13, 14 are also etched somewhat, it is possible prevent them from being overly etched by using a material which is hardly etched like gold, for example.

Such a stacked structure 109 is formed in the state of the substrate panel 100 in FIG. 4A, and thereafter diced to be individualized into the resin substrates 10 shown in FIG. 4C.

Further, as shown in FIG. 1, the semiconductor chips 41, 42 are bonded on the resin substrate 10 with the adhesive layer 30, and a pad (not shown) of each of the semiconductor chips 41, 42 and the bonding pad BP of the resin substrate 10 are joined with the metal wire 20.

Next, the mold resin 50 is formed on the first surface F1 of the resin substrate 10, and the semiconductor chips 41, 42 and the metal wire 20 are covered with the mold resin 50. At this time, the recess portions 16, 18 in FIG. 10 are filled with the mold resin 50. Thus, the mold resin 50 seals the semiconductor chips 41, 42, and is provided between the plating wiring 15 and the wiring layer 12 to electrically separate the plating wiring 15 from the wiring layer 12.

In the case where the plating wiring 15 and the wiring layer 12 are connected, if a semiconductor package is used under an environment of high temperature and high humidity, corrosion may occur from the plating wiring 15 exposed on the outer surface of the resin substrate 10. If corrosion progresses, the bonding pad connected to the plating wiring 15, and even the wiring layer 12, such as the signal wiring, the power supply wiring and the ground wiring, connected to the bonding pad may be corroded. Corrosion of the bonding pad, signal wiring, power supply wiring, ground wiring and the like causes defects and the like.

In contrast, according to the embodiment, by providing the mold resin 50 between the plating wiring 15 and the wiring layer 12, corrosion progressing from the exposed portion of the plating wiring 15 is blocked by the mold resin 50, thus, it is possible to prevent progression of the corrosion to the internal wiring layer 12 (for example, the ground/power supply wiring 12_4 and the signal line 12_3 in FIG. 3).

Second Embodiment

Figure 11:
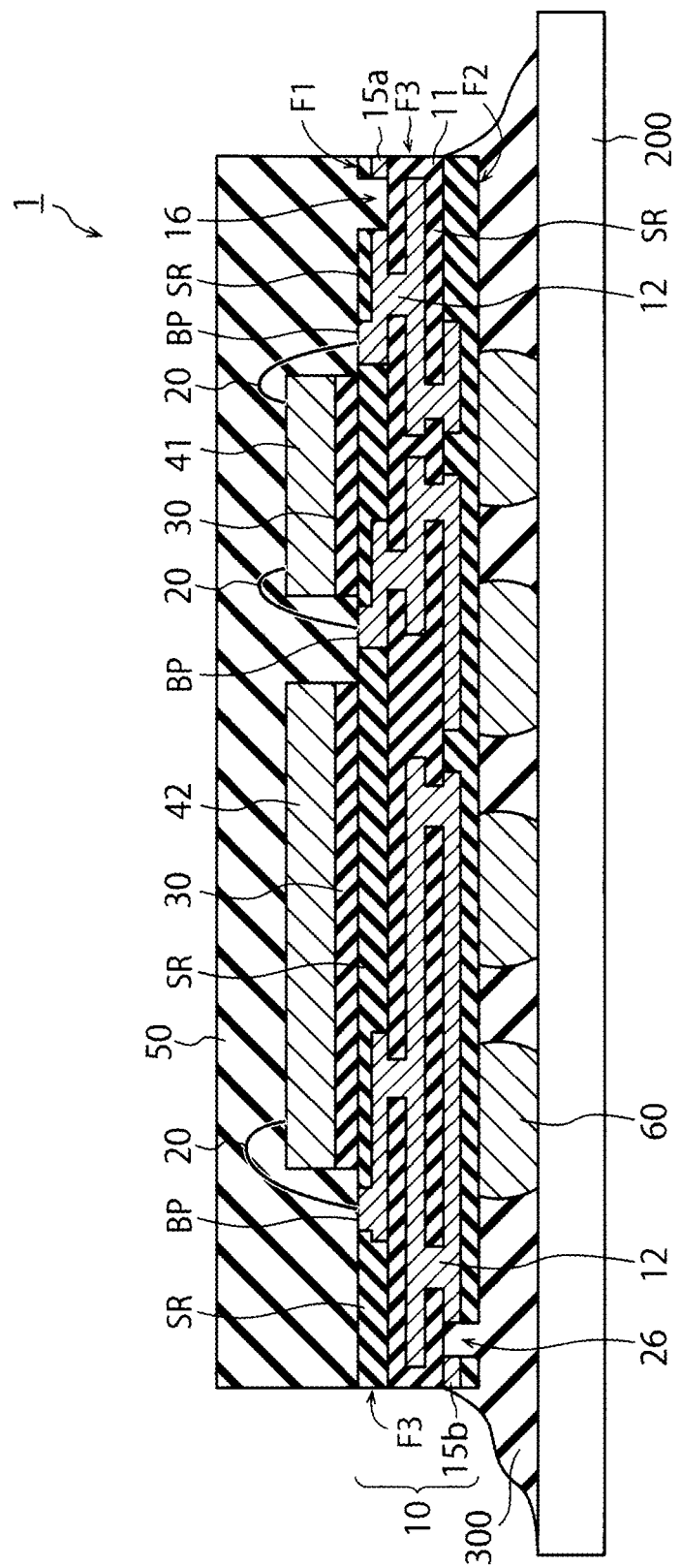
FIG. 11 is a cross-sectional view showing a configuration example of a semiconductor device according to a second embodiment.

FIG. 11 is a cross-sectional view showing a configuration example of a semiconductor device according to a second embodiment. In the second embodiment, the plating wiring 15 is provided not only on the first surface F1 side but also on the second surface F2 side. For example, a plating wiring 15a of FIG. 11 is provided closer to the first surface F1 than to the second surface F2. However, a plating wiring 15b is provided closer to the second surface F2 than the first surface F1. In this case, a recess portion 16 is provided in the first surface F1 in order to disconnect the plating wiring 15a from the wiring layer 12. A recess portion 26 is provided in the second surface F2 in order to disconnect the plating wiring 15b from the wiring layer 12. As described above, the second embodiment is different from the first embodiment in that the second surface F2 also has the recess portion 26. An underfill resin 300 supplied between the resin substrate 10 and a mounting substrate 200 on which the semiconductor device 1 is mounted is filled in the recess portion 26 provided in the second surface F2. Other configurations of the second embodiment may be the same as corresponding configurations of the first embodiment.

When the semiconductor device 1 is manufactured, the recess portion 26 is a hollow, and is exposed to the atmosphere. When the semiconductor device 1 is mounted on the mounting substrate 200, the underfill resin 300 is supplied between the second surface F2 of the semiconductor device 1 and the mounting substrate 200. The underfill resin 300 bonds the semiconductor device 1 onto the mounting substrate 200, and fills the recess portion 26. Thus, the underfill resin 300 electrically separates the plating wiring 15b from the wiring layer 12. In this manner, by providing the underfill resin 300 between the plating wiring 15b and the wiring layer 12, progression of corrosion from the exposed portion of the plating wiring 15b on the side surface F3 of the resin substrate 10 to the wiring layer 12 can be prevented.

As in the first embodiment, the plating wiring 15a is electrically separated from the wiring layer 12 by the recess portion 16 and the mold resin 50 filled in the recess portion 16. Therefore, in the second embodiment, the effects of the first embodiment can also be obtained.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a substrate having a first surface, a second surface opposite to the first surface, and a side surface extending between the first surface and the second surface;
a pad electrode provided on the first surface of the substrate;
an internal wiring provided in the substrate, and electrically connected to the pad electrode;
a first wiring provided in the substrate, and exposed from the substrate at the side surface;
an insulator provided between the first wiring and the internal wiring so as to separate the first wiring from the internal wiring;
a semiconductor chip provided on the substrate, and electrically connected to the pad electrode; and
a resin covering the semiconductor chip,
wherein
the pad electrode includes a metal film provided on an electrode material, and
the first wiring is a plating wiring configured for electrolytically plating the metal film on the surface of the pad electrode.

2. The semiconductor device according to claim 1, wherein the first wiring is in an electrically floating state.

3. The semiconductor device according to claim 1, wherein
the substrate defines a first recess portion between the first wiring and the internal wiring, and
the first wiring is in contact with the insulator at a cut surface in the recess portion.

4. The semiconductor device according to claim 3, wherein the substrate defines a second recess portion at the second surface.

5. The semiconductor device according to claim 4, wherein
the side surface of the substrate is a first side surface,
the substrate has a second side surface opposite to the first side surface, and
the substrate further comprises a second wiring exposed from the second side surface.

6. The semiconductor device according to claim 1, wherein
the first wiring is provided closer to the first surface than the second surface.

7. The semiconductor device according to claim 1, wherein the insulator is the resin.

8. A semiconductor device, comprising:
- a substrate having a first surface, a second surface opposite to the first surface, and a side surface extending between the first surface and the second surface;
- a pad electrode provided on the first surface of the substrate;
- an internal wiring provided in the substrate, and electrically connected to the pad electrode;
- a first wiring provided in the substrate, and exposed from the substrate at the side surface;
- an insulator provided between the first wiring and the internal wiring so as to separate the first wiring from the internal wiring;
- a semiconductor chip provided on the substrate, and electrically connected to the pad electrode; and
- a resin covering the semiconductor chip,
- wherein the first wiring is provided closer to the second surface than the first surface, and
- the substrate includes a first recess portion between the first wiring and the internal wiring.

9. The semiconductor device according to claim 8, wherein the first wiring comprises a first material and the internal wiring comprises the first material.

10. The semiconductor device according to claim 9, wherein the first material is copper.

11. The semiconductor device according to claim 9, wherein the pad electrode comprises the first material.

12. The semiconductor device according to claim 8, wherein the substrate defines a second recess portion at the second surface.

13. The semiconductor device according to claim 12, wherein
- the side surface of the substrate is a first side surface,
- the substrate has a second side surface opposite to the first side surface, and
- the substrate further comprises a second wiring exposed from the second side surface.

14. The semiconductor device according to claim 13, wherein the second recess portion is filled with an underfill that electrically isolates the second wiring from the internal wiring.

15. A semiconductor device, comprising:
- a substrate having a first surface, a second surface opposite to the first surface, and a side surface extending between the first surface and the second surface;
- a pad electrode provided on the first surface of the substrate;
- an internal wiring provided in the substrate, and electrically connected to the pad electrode;
- a first wiring provided in the substrate, and exposed from the substrate at the side surface;
- an insulator provided between the first wiring and the internal wiring so as to separate the first wiring from the internal wiring;
- a semiconductor chip provided on the substrate, and electrically connected to the pad electrode; and
- a resin covering the semiconductor chip,
- wherein the substrate defines a first recess portion between the first wiring and the internal wiring,
- wherein t e first wiring is in contact with the insulator at a cut surface in the recess portion,
- wherein the substrate defines a second recess portion at the second surface,
- wherein the side surface of the substrate is a first side surface,
- wherein the substrate has a second side surface opposite to the first side surface,
- wherein the substrate further comprises a second wiring exposed from the second side surface, and
- wherein the second recess portion electrically and physically separates the second wiring from the internal wiring.

16. The semiconductor device according to claim 15, further comprising an underfill that fills the second recess.

17. The semiconductor device according to claim 15, wherein
- the pad electrode includes a metal film provided on an electrode material, and
- the first wiring is a plating wiring configured for electrolytically plating the metal film on the surface of the pad electrode.

18. The semiconductor device according to claim 15, wherein the first wiring is in an electrically floating state.

19. The semiconductor device according to claim 15, wherein
- the first wiring is provided closer to the first surface than the second surface.

20. The semiconductor device according to claim 15, wherein the insulator is the resin.

* * * * *